US012757495B2

(12) United States Patent
Wang et al.

(10) Patent No.: US 12,757,495 B2
(45) **Date of Patent: *Oct. 6, 2026**

(54) ARRAY SUBSTRATE

(71) Applicants: Beijing BOE Optoelectronics Technology Co., Ltd., Beijing (CN); BOE Technology Group Co., Ltd., Beijing (CN)

(72) Inventors: Haisheng Wang, Beijing (CN); Xue Dong, Beijing (CN); Hailin Xue, Beijing (CN); Xi Chen, Beijing (CN); Yingming Liu, Beijing (CN); Xiaoliang Ding, Beijing (CN); Weijie Zhao, Beijing (CN); Shengji Yang, Beijing (CN); Hongjuan Liu, Beijing (CN); Changfeng Li, Beijing (CN); Wei Liu, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/014,659

(22) Filed: Jan. 9, 2025

(65) Prior Publication Data

US 2025/0151405 A1 May 8, 2025

Related U.S. Application Data

(63) Continuation of application No. 18/199,003, filed on May 18, 2023, now Pat. No. 12,211,857, which is a (Continued)

(30) Foreign Application Priority Data

Jan. 27, 2015 (CN) ........................ 201510041311.7

(51) Int. Cl.
*G06F 3/044* (2006.01)
*G06F 3/041* (2006.01)
(Continued)

(52) U.S. Cl.
CPC ........... *H10D 86/60* (2025.01); *G06F 3/0412* (2013.01); *G06F 3/0443* (2019.05); *H10D 86/441* (2025.01); *G06F 2203/04103* (2013.01)

(58) Field of Classification Search
CPC combination set(s) only.
See application file for complete search history.

(56) References Cited

U.S. PATENT DOCUMENTS

2003/0098939 A1* 5/2003 Min .................. G02F 1/136286 349/141
2009/0218646 A1* 9/2009 Okada ................... H10F 39/195 257/E31.124

(Continued)

*Primary Examiner* — William Boddie
*Assistant Examiner* — Alecia D English
(74) *Attorney, Agent, or Firm* — Banner & Witcoff, Ltd.

(57) ABSTRACT

An array substrate is provided. The array substrate includes a base substrate and a plurality of gate lines, a plurality of data lines, a common electrode layer and a plurality of pixel units arranged in an array disposed on the base substrate. Each of the pixel units includes a plurality of sub-pixel units defined by gate lines and data lines disposed to intersect each other laterally and vertically. The common electrode layer includes a plurality of common electrode blocks that double as self-capacitance electrodes, each of the common electrode blocks is connected with at least one wire, and the wires are in the middle of sub-pixel units of a same column.

16 Claims, 14 Drawing Sheets

Related U.S. Application Data continuation of application No. 17/478,471, filed on Sep. 17, 2021, now Pat. No. 11,710,748, which is a continuation-in-part of application No. 14/892,419, filed as application No. PCT/CN2015/081640 on Jun. 17, 2015, now Pat. No. 11,139,317.

(51) Int. Cl.

| | |
|---|---|
| ***H10D 86/40*** | (2025.01) |
| ***H10D 86/60*** | (2025.01) |

(56) References Cited

U.S. PATENT DOCUMENTS

2015/0042599 A1* 2/2015 Lukanc ............... G06F 3/04184 349/12
2015/0185938 A1* 7/2015 Han ...................... G06F 3/0445 345/173

* cited by examiner

ARRAY SUBSTRATE

This application is a continuation application of U.S. patent application Ser. No. 18/199,003 filed on May 18, 2023, which is a continuation application of U.S. patent application Ser. No. 17/478,471 filed on Sep. 17, 2021, which is a continuation-in-part of U.S. patent application Ser. No. 14/892,419 filed on Nov. 19, 2015, which is a U.S. National Phase Entry of International Application No. PCT/CN2015/081640 filed on Jun. 17, 2015, which claims priority to and the benefit of Chinese patent application No. 201510041311.7 filed on Jan. 27, 2015. The above-identified applications are incorporated by reference herein in their entirety.

TECHNICAL FIELD

Embodiments of the present disclosure relate to an array substrate.

BACKGROUND

At present, touch panels formed by combining touch function and display function have been used more and more. Popular touch panels include resistive touch panels, capacitive touch panels and optical touch panels. Capacitive touch panels have become the main stream due to their high accuracy, multipoint touch and high touch resolution. Capacitive touch panels are generally classified into mutual-capacitance touch panels and self-capacitance touch panels. As compared to a mutual-capacitance touch panel, a self-capacitance touch panel is implemented with a single layer self-capacitance electrode structure having simple structure, which resulting in advantages such as low cost and hence is applied more popular.

SUMMARY

Embodiments of the present disclosure provide an array substrate, to increase aperture ratio of pixel units.

At least one embodiment of the present disclosure provides an array substrate comprising a base substrate and a plurality of gate lines, a plurality of data lines, a common electrode layer, and a plurality of pixel units, arranged in an array disposed on the base substrate. Each of the pixel units comprises a plurality of sub-pixel units defined by the gate lines and the data lines disposed to intersect each other laterally and vertically; a plurality of wires, wherein the common electrode layer comprises a plurality of common electrode blocks that double as self-capacitance electrodes, each of the common electrode blocks is connected to at least one corresponding wire of the plurality of wires, the common electrode blocks are connected with the wires through first vias; wherein two adjacent data lines of the plurality of data lines define a column of the sub-pixel units, two adjacent gate lines of the plurality of gate lines define a row of the sub-pixel units, the wires and the data lines are disposed in a same layer and extend in a same direction of the column of the sub-pixel units; and a plurality of pixel electrodes, wherein an orthographic projection of the at least one corresponding wire on the base substrate crosses an orthographic projection of each of pixel electrodes of the column of the sub-pixel units on the base substrate. A width of the wire in a direction of the row of the sub-pixel units is less than a width of a pixel electrode in the direction of the row of the sub-pixel units in a region where the orthographic projection of the at least one of the wires on the base substrate and the orthographic projection of pixel electrodes of the column of the sub-pixel units overlap. The pixel unit comprises at least a red sub-pixel unit, a blue sub-pixel unit, and a green sub-pixel unit, sub-pixel units with a same color at which the wires are located belong to different ones of the pixel units, a same column of the sub-pixel units has a same color, a same row of the sub-pixel units are arranged in a sequence of red, green, and blue; an extending direction of the wires is the same as an extending direction of the column of the blue sub-pixel units, only one wire is disposed in each sub-pixel unit, each of the column of the sub-pixel units comprises one wire. The array substrate comprises a first electrode and a second electrode, and in a direction perpendicular to the base substrate, the second electrode is disposed between the base substrate and the first electrode, the first electrode is the common electrode and the second electrode is the pixel electrode, or the first electrode is the pixel electrode and the second electrode is the common electrode. The first electrode has a plurality of slits extending in the direction of the column of the sub-pixel units, and the plurality of slits comprises at least one first slit and at least one second slit, one of the wires corresponds in position to the at least one second wire, the first electrode of each of the sub-pixel units in the same column of the sub-pixel units has a same count of the slits, the at least one first slit and the at least one second slit of the first electrode of each of the sub-pixels in the same column of the sub-pixel units are arranged in a same sequence. A width of the at least one second slit in the direction of the row of the sub-pixel units is larger than a width of the at least one first slit in the direction of the row of the sub-pixel units.

At least one embodiment of the present disclosure provides a base substrate, a plurality of gate lines, a plurality of data lines, a common electrode layer, and a plurality of pixel units, arranged in an array disposed on the base substrate. Each of the pixel units comprises a plurality of sub-pixel units defined by the gate lines and the data lines disposed to intersect each other laterally and vertically; a plurality of wires, and a driving IC, wherein the common electrode layer comprises a plurality of common electrodes that double as self-capacitance electrodes, each of the common electrode blocks is connected to the driving IC through at least one of the plurality of wires, the common electrode blocks are connected with the wires through first vias; wherein two adjacent data lines of the plurality of data lines define a column of the sub-pixel units, two adjacent gate lines of the plurality of gate lines define a row of the sub-pixel units, the wires and the data lines are disposed in a same layer and extend in a same direction of the column of the sub-pixel units; and a plurality of pixel electrodes, wherein an orthographic projection of the at least one corresponding wire on the base substrate crosses an orthographic projection of each of pixel electrodes of the column of the sub-pixel units on the base substrate. A width of the wire in a direction of the row of the sub-pixel units is less than a width of the pixel electrode in the direction of the row of the sub-pixel units in a region where the orthographic projection of the at least one of the wires on the base substrate and the orthographic projection of pixel electrodes of the column of the sub-pixel units overlap. The pixel unit comprises at least a red sub-pixel unit, a blue sub-pixel unit, and a green sub-pixel unit, sub-pixel units with a same color at which the plurality of wires are located belong to different ones of the pixel units, a same column of the sub-pixel units has a same color, a same row of the sub-pixel units are arranged in a sequence of red, green, and blue, an extending direction of the wires is the same as an extending direction of the column of the sub-pixel units, only one wire is disposed in each sub-pixel unit, each of the column of the sub-pixel units comprises one wire. The array substrate comprises a first electrode and a second electrode, and in a direction perpendicular to the base substrate, the second electrode is disposed between the base substrate and the first electrode, the first electrode is the common electrode and the second electrode is the pixel electrode, or the first electrode is the pixel electrode and the second electrode is the common electrode. The first electrode has a plurality of slits extending in the direction of the column of the sub-pixel units, and the plurality of slits comprises at least one first slit and at least one second slit, one of the wire corresponds in position to the at least one second wire, the first electrode of each of the sub-pixel units in the same column of the sub-pixel units has a same count of the slits, the at least one first slit and the at least one second slit of the first electrode of each of the sub-pixels in the same column of the sub-pixel units are arranged in a same sequence. A width of the at least one second slit in the direction of the row of the sub-pixel units is larger than a width of the at least one first slit in the direction of the row of the sub-pixel units.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

Figure 1A:
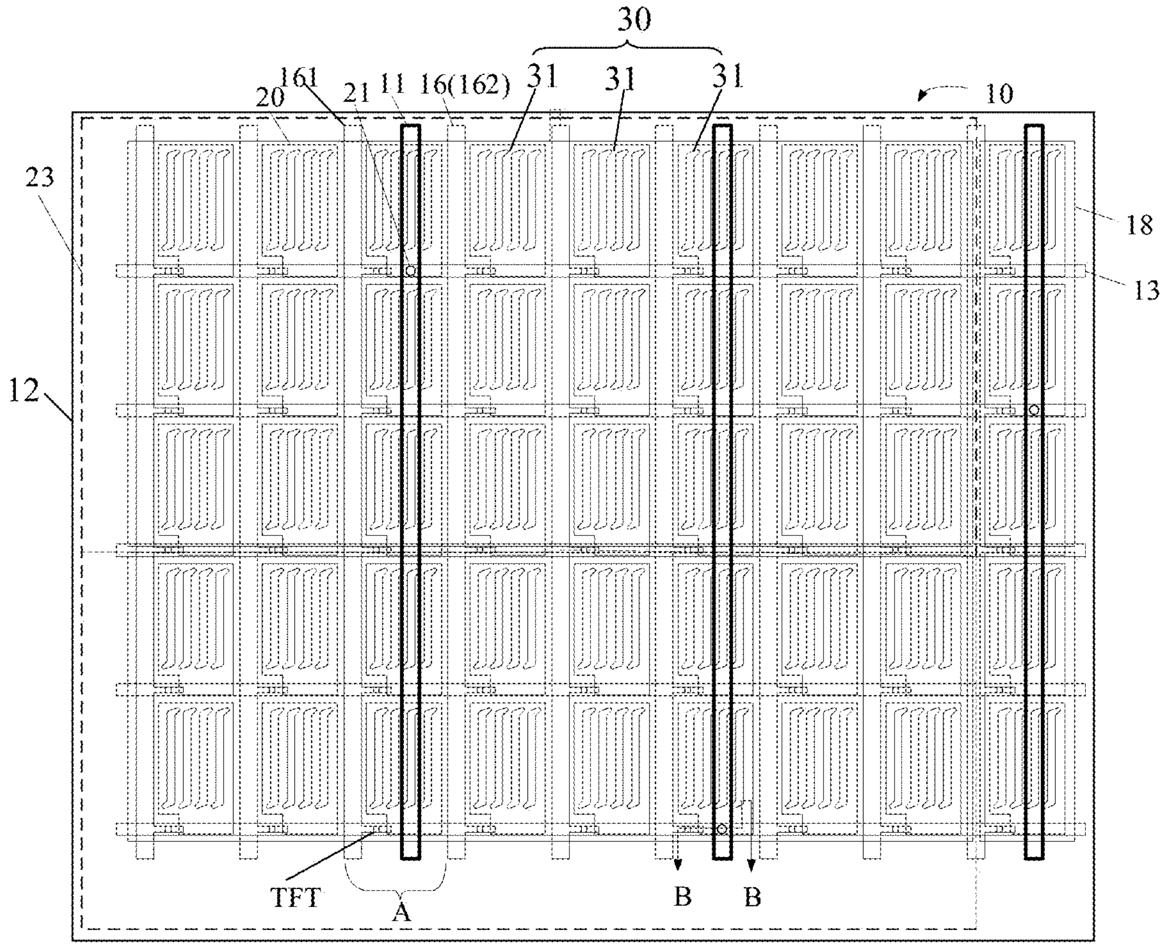
FIG. 1*a* is a structure diagram of an array substrate provided in an embodiment of the present disclosure.

Reference numerals: 10. Array substrate; 11. Wire; 12. Base substrate; 13. Gate line; 14. Gate insulating layer; 15. Active layer; 16. Data line; 17. First protection layer; 18. Common electrode layer; 19. Second protection layer; 20. Pixel electrode; 21. First via; 22. Second via; 23. Common electrode block; 24. Gate line and gate electrode; 25. Source electrode; 26. Drain electrode; 27. Driving IC.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. Terms such as “first”, “second” and the like used in the present disclosure do not indicate any sequence, quantity or significance but only for distinguishing different constituent parts. Similarly, terms such as “one”, “a” or “the” do not mean to limit quantity, but denote the presence of at least one. The terms “comprises,” “comprising,” “includes,” “including,” etc., are intended to specify that the elements or the objects stated before these terms encompass the elements or the objects and equivalents thereof listed after these terms, but do not preclude the other elements or objects. The phrases “connect”, “connected”, etc., are not intended to define a physical connection or mechanical connection, but may include an electrical connection, directly or indirectly. “On,” “under,” “right,” “left” and the like are only used to indicate relative position relationship, and when the position of the object which is described is changed, the relative position relationship may be changed accordingly.

The inventors of the present application have noticed the following during study. A self-capacitance touch panel includes a plurality of pixel units. In a pixel unit, there is a space between a wire connected with the self-capacitance electrode and an adjacent data line. Wires and data lines are opaque by themselves. In order to prevent spaces between wires and data lines from leaking light, it is required that black matrix of the self-capacitance touch panel to cover data lines, wires and spaces therebetween, which leads to a large coverage by black matrix and in turn a reduced aperture ratio for pixel units.

Referring to FIG. 1*a*, the array substrate 10 provided in an embodiment of the present disclosure includes: a base substrate 12, a plurality of gate lines 13, a plurality of data lines 16, a common electrode layer 18 and a plurality of pixel units 30 arranged in an array disposed on the base substrate 12, wherein each pixel unit 30 includes a plurality of sub-pixel units 31 each defined by gate lines 13 and data lines 16 disposed to intersect each other in lateral and vertical directions; the common electrode layer 18 includes a plurality of common electrode blocks 23 that may double as self-capacitance electrodes, each common electrode block 23 is connected with at least one wire 11 and the wire 11 is located in the middle of sub-pixel units 31 of the same column (as illustrated in FIG. 1*a*). For example, as illustrated in FIG. 1*a*, sub-pixel units of column A share one wire 11 and the wire 11 is located in the middle of sub-pixel units of column A.

It is to be noted that sub-pixel units in the same column are mentioned with respect to the extending direction of wire 11, i.e., they refer to the sub-pixel units disposed at the place where the wire is located in the extending direction of wire 11. For the case illustrated in FIG. 1*a*, when the viewing angle is changed, the direction of the column in which sub-pixel units in the same column are located will change accordingly. Further, the middle of sub-pixel units refers to the middle region of sub-pixel units (namely opening region) with respect to periphery (blocked region) of sub-pixel units.

In at least one embodiment, wires and data lines or gate lines may be disposed in the same layer, which allows to form wires, data lines or gate lines by one patterning process. Alternatively, wires and data lines or gate lines may also be disposed in different layers. For example, while forming wires separately by one patterning process, or forming wires simultaneously with other layers such as the layer in which gate electrodes are located on the array substrate, wires and gate lines or data lines may be disposed in different layers.

In the array substrate 10 provided in embodiments of the present disclosure, wires 11 connected with the common electrode layer 18 are located in the middle of sub-pixel units of the same column (for example, wires are disposed in regions on the base substrate where pixel electrodes of sub-pixel units and the common electrode blocks have common orthogonal projections). The middles of sub-pixel units belong to opening regions (transmission region), while opening regions are not covered by black matrix. Therefore, the black matrix only needs to cover data lines (or gate lines 13). Since the wires 11 are thin, they are not visible even in sub-pixel units, it's not required to block wires 11, and spaces between data lines 16 (or gate lines 13) and wires 11 with the black matrix. Therefore, embodiments of the present disclosure can reduce the coverage of the black matrix, increase the area of opening region, and thereby increasing aperture ratio of the pixel units. And, in an embodiment of the present disclosure, wires 11 and data lines 16 (or layers on the array substrate originally such as gate lines 13) may be disposed in the same layer, which allows to form wires 11 and data lines 16 (or gate lines 13) with one patterning process in the manufacturing process of array substrate 10, thereby reducing one step of masking process.

There are various ways to dispose wires 11 in the above-mentioned array substrate, which, in an embodiment of the present disclosure, may include, but not limited to the following disposition ways.

In arrangement mode I, referring to FIG. 1*a*, each common electrode block 23 is connected with a wire 11 and sub-pixel units where the wire 11 is located belong to different pixel units.

When wires 11 are disposed in this mode, one wire 11 will not appear in two or more sub-pixel units in the same one pixel unit and there is only one sub-pixel unit in a pixel unit that corresponds to the wire 11. For example, as illustrated in FIG. 1*a*, the part of pixel region of the array substrate illustrated in the figure includes 9 columns and 5 rows of sub-pixel units, and dashed lines denote regions corresponding to the common electrode block 23. In the present embodiment, the denoted region includes a top and a bottom common electrode blocks 23, each corresponding to 3*8=24 sub-pixel units. A row of sub-pixel units is omitted for the bottom common electrode block 23. It is understood that FIG. 1*a* is merely a schematic diagram. For example, each common electrode block 23 corresponds to the same number of sub-pixel units. One common electrode block 23 is connected with only one wire 11. The first three sub-pixel units in the first row of sub-pixel units constitute one pixel unit in which only one sub-pixel unit is provided with the wire 11.

Figure 2:
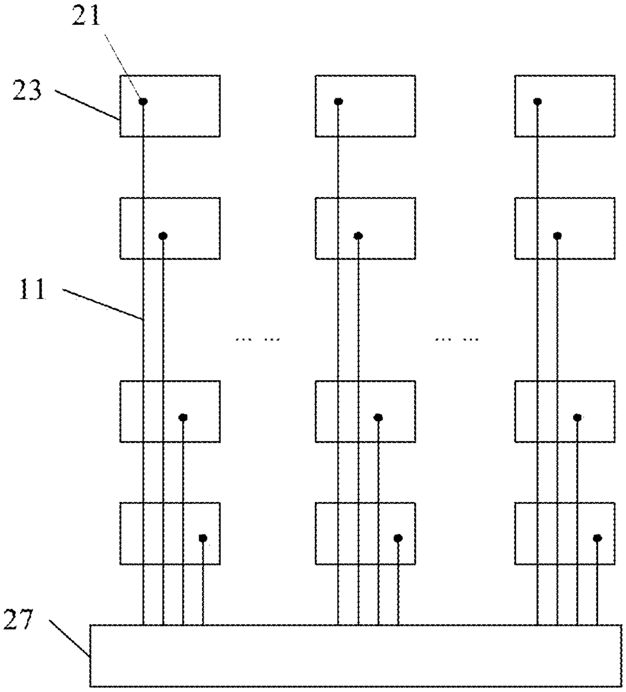
FIG. 2 is a connection relationship diagram of wires and common electrode blocks in FIG. 1*a;*

It is to be noted, the display device including the array substrate further includes a driver circuit or the driver circuit may be mounted directly on the array substrate. The driver circuit (hereafter referred to as simply Driving IC (Integrated circuit) 27) may be as illustrated in FIG. 2, and the driving IC 27 is configured to drive component for implementing touch function and/or components for implementing display function. The common electrode blocks 23 are connected with the driving IC 27 through wires 11. For example, referring to FIG. 2, one common electrode block 23 is connected with only one wire 11. Therefore, one common electrode block 23 is connected with the driving IC 27 through one wire 11.

Figure 1B:
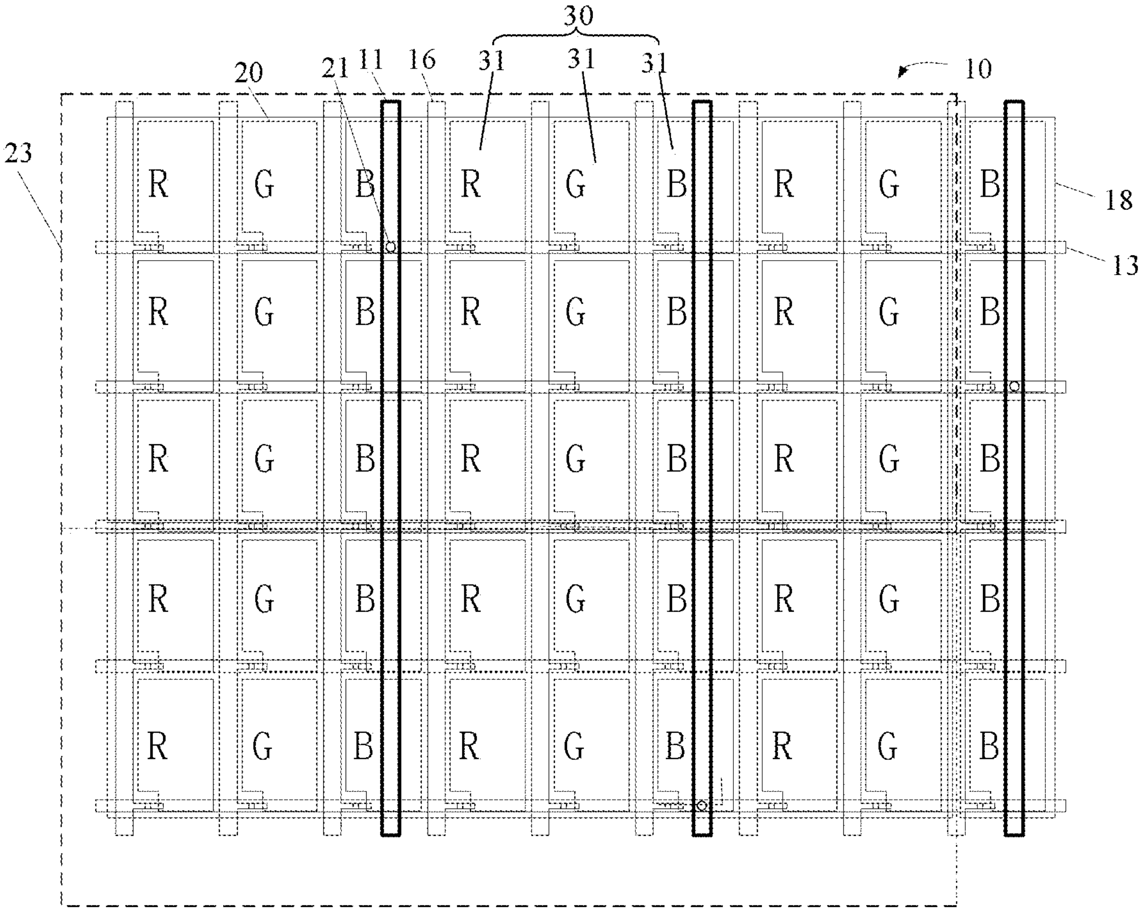
FIG. 1*b* is a structure diagram illustrating each pixel unit provided in an embodiment of the present disclosure including a red, a blue and a green sub-pixel units.

Furthermore, for example, as illustrated in FIG. 1*b*, each pixel unit includes at least a red (R), a blue (B) and a green (G) sub-pixel unit. In each pixel unit, the wire 11 that is connected with the common electrode is located in the middle of one of the red, blue and green sub-pixel units. For example, since the blue sub-pixel unit has the least influence on transmittance, the wire 11 that is connected with common electrode 18 is arranged in the middle of blue sub-pixel unit among the red, blue and green sub-pixel units. For example, each pixel unit includes a red, a blue and a green sub-pixel unit. The same one column of pixel units includes three columns of sub-pixel units, namely a column of red sub-pixel units, a column of blue sub-pixel units and a column of green sub-pixel units, respectively. The wire 11 is disposed in the middle of blue sub-pixel units in the column of pixel units. The sub-pixel units with a same color at which the wires are located belong to different ones of the pixel units.

As shown in FIG. 1*b*, a first distance from the orthographic graph of the wire 11 on the base substrate 10 to an orthographic graph of the red sub-pixel unit on the base substrate 10 in the direction of the row of the sub-pixel units (a first direction) is different from a second distance from the orthographic graph of the wire 11 on the base substrate 10 to an orthographic graph of the green sub-pixel unit on the base substrate 10 in the direction of the row of the sub-pixel units. For example, the first distance is less than the second distance, as illustrated in FIG. 1*b*.

Figure 3:
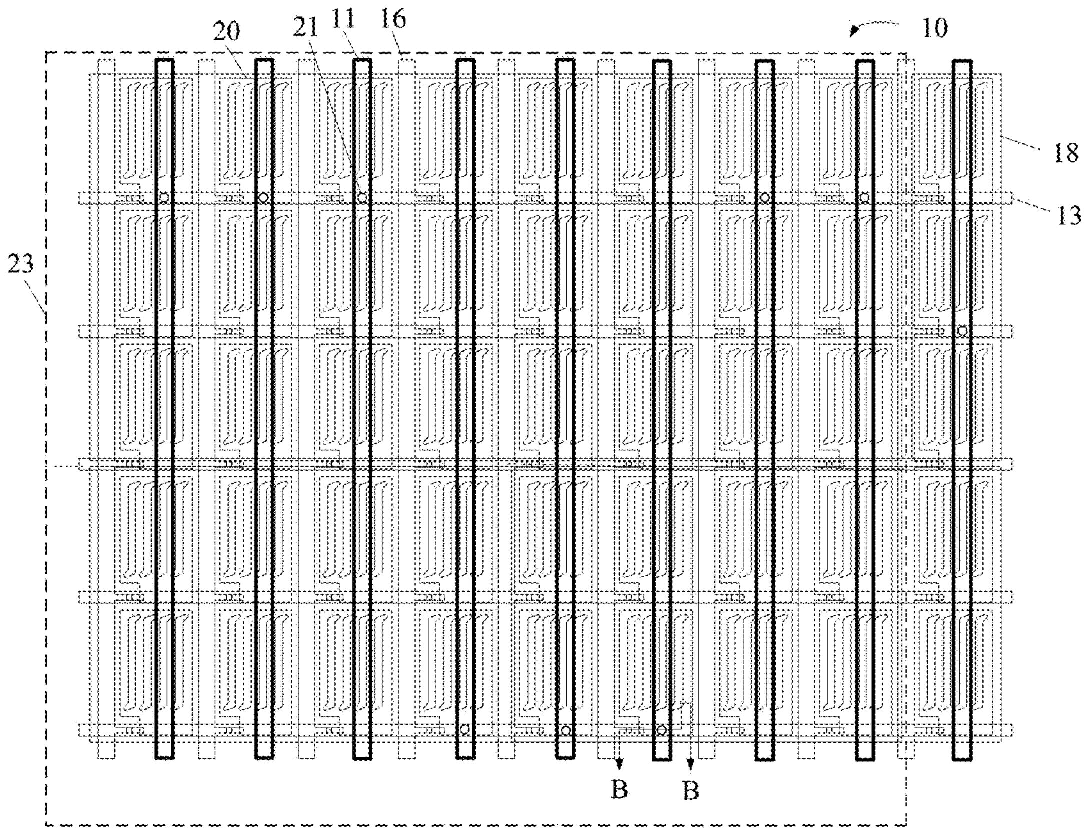
FIG. 3 is a structure diagram of another array substrate provided in an embodiment of the present disclosure.

In arrangement mode II, referring to FIG. 3, each common electrode block 23 is connected with a plurality of wires 11 and the middle of a plurality of sub-pixel units in each pixel unit correspond to wires 11, respectively. For example, as illustrated in FIG. 3, in the sub-pixel units of 9 columns and 5 rows as denoted, each common electrode block 23 corresponds to 3*8=24 sub-pixel units. Therefore, in order for the columns of sub-pixel units to all have wires 11 passing through in their middle, a wire 11 is disposed in the middle of sub-pixel units for all the 8 columns. With such a design, it is possible to choose one wire 11 to transmit signals while driving and other wires 11 are used as standby wires, which can realize redundancy design of the driving circuit to enhance reliability of driving.

Figure 4:
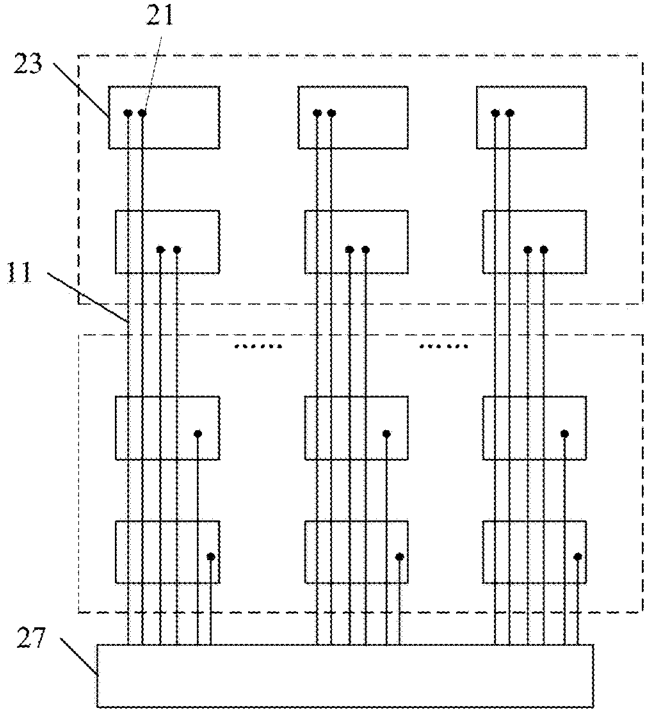
FIG. 4 is a connection relationship diagram of wires and common electrode blocks in another embodiment.

In arrangement mode III, referring to FIG. 4, in order to reduce the delay caused by signal transmission in the driving process, for example, the common electrode block 23 located at the distal end of the driving IC 27 is connected with the driving IC 27 through a plurality of wires 11, and the remaining common electrode blocks 23 located at the proximal end of driving IC 27 are connected with the driving IC 27 through one wire 11. For example, referring to FIG. 4, the common electrode blocks 23 in the top dashed box are those at distal end of driving IC 27 and are connected with the driving IC 27 through two wires 11. The common electrode blocks 23 in the bottom dashed box are those located at the proximal end of driving IC and are connected with the driving IC through one wire 11. With such a design, on the one hand, it is possible to reduce delay caused by signal transmission in the driving process, and on the other hand, the number of wires 11 may be reduce as compared to the arrangement mode II.

The distal end in the present embodiment is described in terms of the distance from a common electrode block to the driving IC 27. The end apart from the driving IC 27 is referred to as distal end, and the end close to the IC 27 is referred to as proximal end. For example, if there are 20 rows of pixel units and 10 rows of common electrode blocks disposed from top to bottom on the entire array substrate, it is possible to use the common electrode block in the middle position as a reference point, the first two or three rows on the top are referred to as common electrode blocks at distal end of the driving IC 27, while the other rows are referred to as common electrode blocks at proximal end of the driving IC 27. Of course, the numbers of common electrode blocks at the distal and proximal ends may be set according to practical requirement, which will not be described any more here.

It should be noted that since the common electrode blocks 23 may double as self-capacitance electrodes, a common electrode block 23 corresponds to a plurality of sub-pixel units in any of the above embodiments. For example, as illustrated in FIG. 1*a*, a common electrode block 23 corresponds to 3*8=24 sub-pixel units. In at least one embodiment, the shape of common electrode blocks 23 may be for example square, rectangle, diamond or other regular polygons. For example, the common electrode blocks 23 are square electrode blocks with sides of 4 mm-5 mm.

Figure 5:
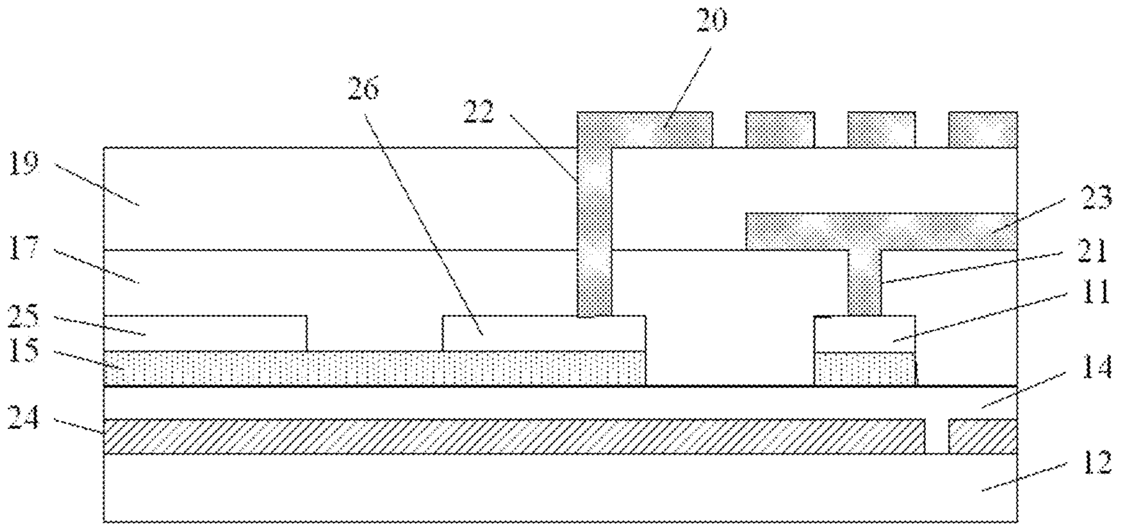
FIG. 5 is a sectional view in B-B direction in FIG. 1*a* or 3.

In at least one embodiment, the wire 11 may be located under the common electrode layer 18, or over the common electrode layer 18 (for example, wire formed with separate patterning process). For example, the array substrate 10 may further include a first protection layer 17 disposed above the wire 11, and the common electrode layer 18 may be disposed on the first protection layer 17, as illustrated in FIG. 5. Alternatively, the array substrate 10 may include a first protection layer disposed on the common electrode layer and the wires are disposed on the first protection layer.

Taking the case illustrated in FIG. 5 as an example, in addition to the above-mentioned structure, the array substrate 10 in embodiments of the present disclosure may further include a gate insulating layer 14 disposed on the plurality of gate lines 13, an active layer 15 disposed on the gate insulating layer 14, a plurality of data lines 16 and wires 11 disposed on the active layer 15, a first protection layer 17 disposed on the plurality of data lines 16 and wires 11, a common electrode layer 18 disposed on the first protection layer 17, a second protection layer 19 disposed on the first protection layer 17 and the common electrode layer 18, and pixel electrodes 20 disposed on the second protection layer 19.

The specific structure of the above-mentioned array substrate 10 will be explained below with respect to the sub-pixel unit in array substrate 10 as an example.

For example, referring to FIG. 5, the sub-pixel units include a gate layer 24 disposed on the base substrate 12 (since the gate lines 13 and the gate electrodes are formed of the same layer of metal, 24 in the figure denotes gate lines 13 and gate electrodes and this layer will be referred to as a gate layer hereinbelow), a gate insulating layer 14 disposed on the gate layer 24, an active layer 15 disposed on the gate insulating layer 14, source electrode 25/drain electrode 26 and wires 11 disposed on the active layer 15, a first protection layer 17 disposed on the source electrode 25/drain electrode 26 and the wires 11, a common electrode layer 18 disposed on the first protection layer 17, a second protection layer 19 disposed on the first protection layer 17 and the common electrode layer 18, and pixel electrodes 20 disposed on the second protection layer 19. It is to be noted that the common electrode layer 18 includes a plurality of common electrode blocks.

In the above-mentioned array substrate 10, the common electrode blocks 23 in the common electrode layer 18 are connected with the wires 11. For example, referring to FIGS. 1*a*, 3 and 5, first vias 21 are provided in the first protection layer 17 in the array substrate through which the common electrode blocks 23 are connected with the wires 11. The vias 21 through which the wires 11 and the common electrode blocks are connected in the figure are only one connection mode. The present application includes, but not limited to this connection mode. In addition, second vias 22 are provided in the second protection layer 19 in the array substrate 20, through which the pixel electrodes 20 are connected with the drain electrodes 25.

To facilitate patterning, as illustrated in FIG. 2 or 4, in at least one embodiment, projections of first vias 21 corresponding to the common electrode blocks 23 in the same column on the base substrate are staggered successively. Thus, it is both convenient to form first vias 21 by patterning, and convenient to form the wires 11 by patterning. It is to be noted that common electrode blocks in the same column are mentioned with respect to the extending direction of the wires, i.e., they refer to the common electrode blocks disposed at the wires along the extension direction of wires 11. For cases illustrated in FIG. 2 or 4, when the viewing angle is changed, the direction of column (a second direction) in which common electrode blocks in the same column are located changes accordingly.

Figure 9:
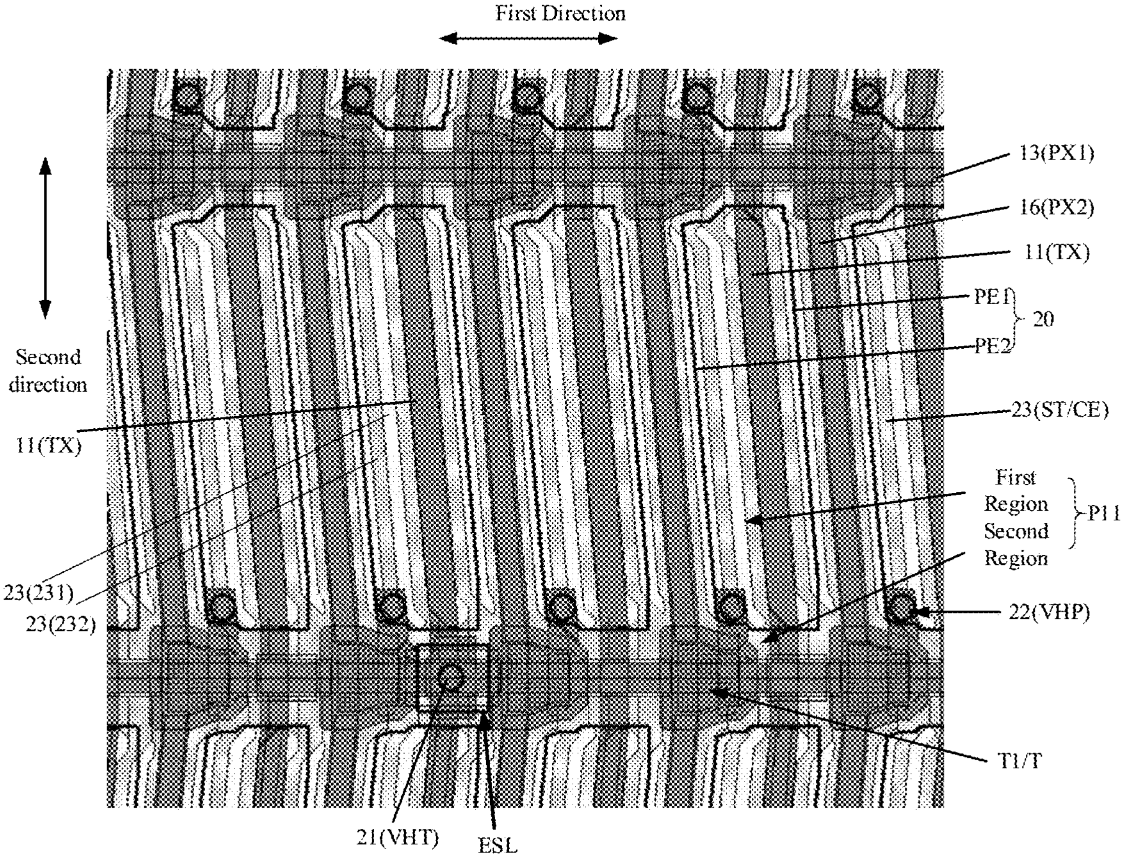
FIG. 9 is a schematic view of an array substrate provided in an embodiment of the present disclosure.

FIG. 9 is a schematic view of an array substrate provided in an embodiment of the present disclosure.

In some embodiments, as illustrated in FIG. 9, a third distance from an orthographic graph of the first via 21 (VHT) on the base substrate to an orthographic graph of the gate line 11 on the base substrate in the second direction is less than a fourth distance from an orthographic graph of the second via 22 (VHP) on the base substrate to the orthographic graph of the gate line 13 on the base substrate in the direction, so that the aperture ratio of pixel units is increased. For example, as illustrated in FIG. 9, the orthographic graph of the first via 21 and the orthographic graph of the gate line 13 on the base substrate at least partially overlap. That is, the third distance is substantially zero, and thus, the third distance is less than the fourth distance.

Figure 10:
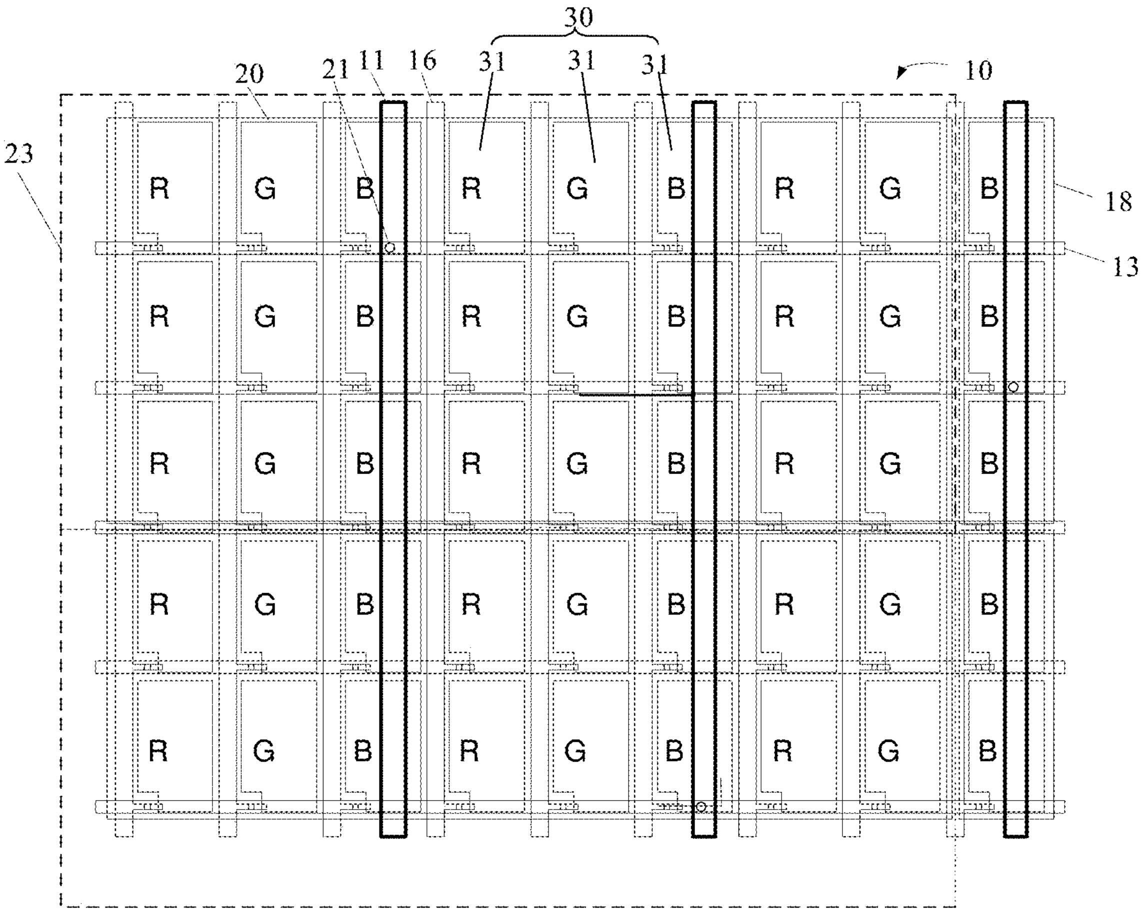
FIG. 10 is a structure diagram illustrating each pixel unit provided in an embodiment of the present disclosure including a red, a blue and a green sub-pixel units.

FIG. 10 is a structure diagram illustrating each pixel unit provided in an embodiment of the present disclosure including a red, a blue and a green sub-pixel units.

In some embodiments, as illustrated in FIG. 10, the width of the wire 11 in the direction of the row of the sub-pixel units (the first direction) is greater than a width of at least one of the data lines 16 in the direction of the row of the sub-pixel units (the first direction). In this case, the wire 11 is not easy to be broken.

Figure 11:
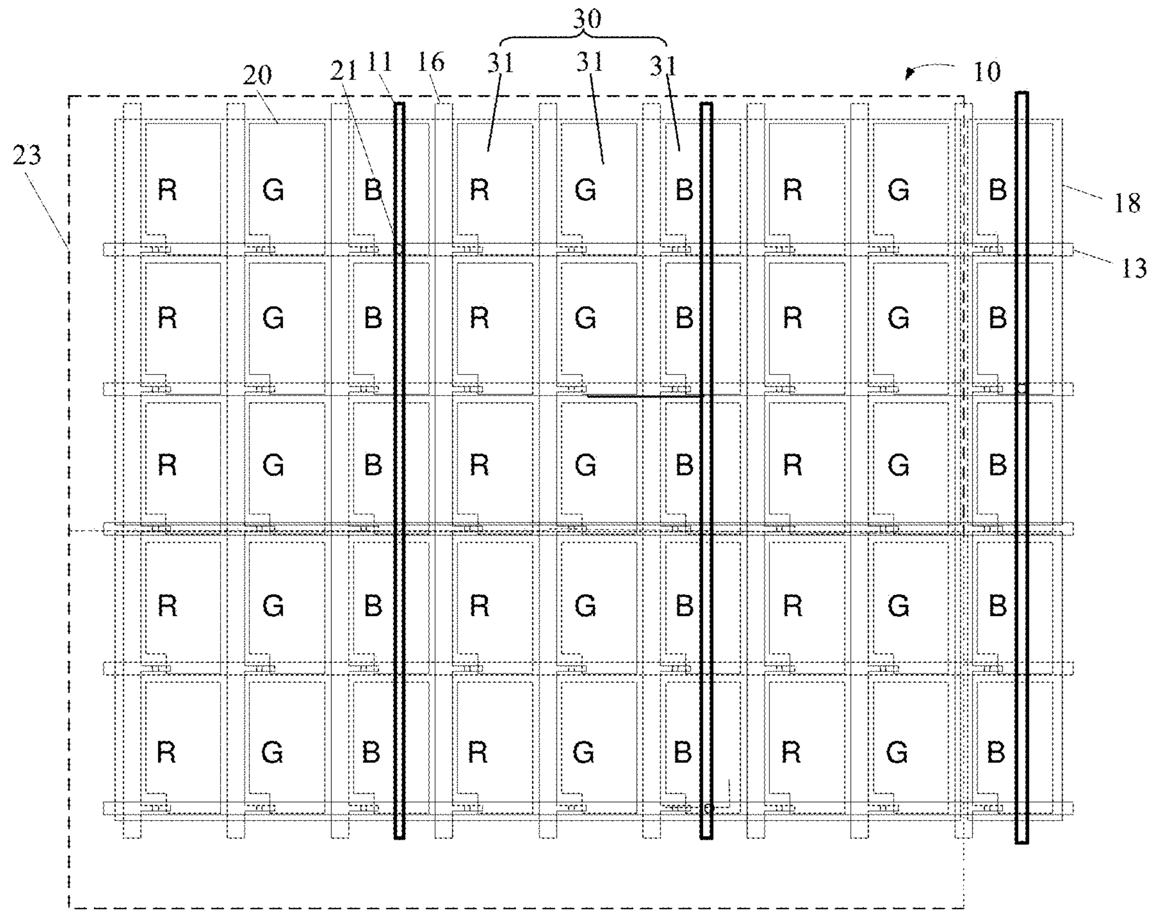
FIG. 11 is a structure diagram illustrating each pixel unit provided in an embodiment of the present disclosure including a red, a blue and a green sub-pixel units.

FIG. 11 is a structure diagram illustrating each pixel unit provided in an embodiment of the present disclosure including a red, a blue and a green sub-pixel units.

In some embodiments, as illustrated in FIG. 11, the width of the wire 11 in the direction of the row of the sub-pixel units (the first direction) is less than a width of at least one of the data lines 16 in the direction of the row of the sub-pixel units (the first direction). In this case, because the width of the wire is thin, the transmittance of the pixel unit can be improved.

As shown in FIG. 9, the array substrate includes a first electrode located on the base substrate 12 (BS). The first electrode includes a plurality of strip-shaped electrodes 232 extending along the second direction; in the first sub-pixel region, the wire (touch signal line) 11 is on the base substrate. The orthographic projection on the BS is at least partially located between the orthographic projections on the substrate BS of adjacent strip electrodes 231 in the first direction. By positioning the touch signal line between adjacent strip electrodes, it is possible to avoid overlapping of the touch signal line with the adjacent strip electrodes as much as possible, so as to reduce the capacitance between the touch signal line and the first electrode. The first electrode can be a common electrode or a pixel electrode.

In some embodiments, the array substrate further includes a second electrode. In a direction perpendicular to the base substrate 12, the second electrode is disposed between the base substrate and the first electrode. FIG. 5 illustrates an embodiment in which the pixel electrode is the first electrode and the common electrode is the second electrode.

Figure 12:
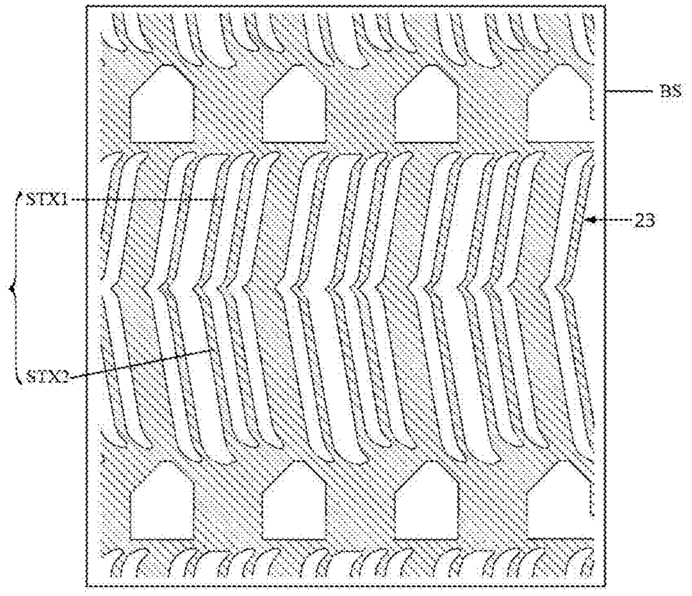
FIG. 12 is a schematic view of a common electrode of an array substrate provided by an embodiment of the present application.

FIG. 12 is a schematic view of a common electrode of an array substrate provided by an embodiment of the present application In some embodiment, as shown in FIG. 9 and FIG. 12, the common electrode 23 has a plurality of slits 231 extending in the direction of the column of the sub-pixel units (second direction), and the wire 11 (TX) corresponds to at least one corresponding slit of the plurality of slits 231 in position. That is, the orthographic graph of the corresponding slit on the base substrate and the orthographic graph of the wire on the base substrate at least partially overlap. In this case, the common electrode is the first electrode.

In some embodiments, as shown in FIG. 1*a* and FIG. 9, a proportion of an area where the orthographic graph of the wire 11 on the base substrate 10 and an orthographic graph of the slits 231 on the base substrate overlap to an area of the wire 11 is equal to 50% or greater than 50%. Because the proportion is more than 50%, the coupling capacitance between the first electrode and the wire can be reduced.

In some embodiment, as shown in FIG. 9, a width of the at least one corresponding slit 231 in the direction of the row of the sub-pixel units (first direction) is larger than a width of other slits of the plurality of slits in the direction of the row of the sub-pixel units. Because the width of the corresponding slit is larger than that of other slits, the coupling capacitance between the first electrode and the wire can be reduced.

In some embodiments, as shown in FIG. 9, each of sub-pixels SP includes a first region and a second region surrounding the first region; when the array substrate is applied in a display device, the first region of the sub-pixel is an opening region that is not blocked by the black matrix layer in the display device, and the second region of the sub-pixel region is a non-open region that is blocked by the black matrix layer.

Figure 13:
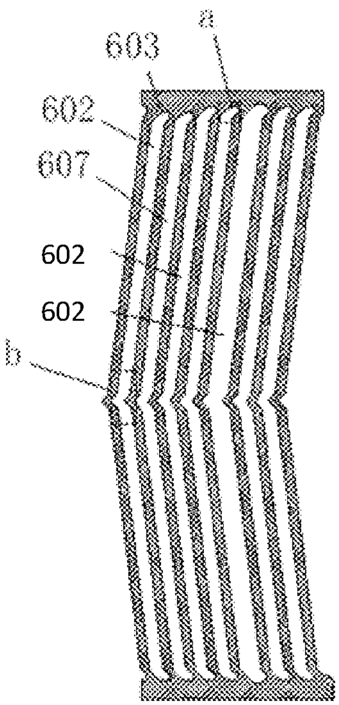
FIG. 13 is s part of schematic view of a pixel electrode of an array substrate provided by an embodiment of the present application.
Figure 14:
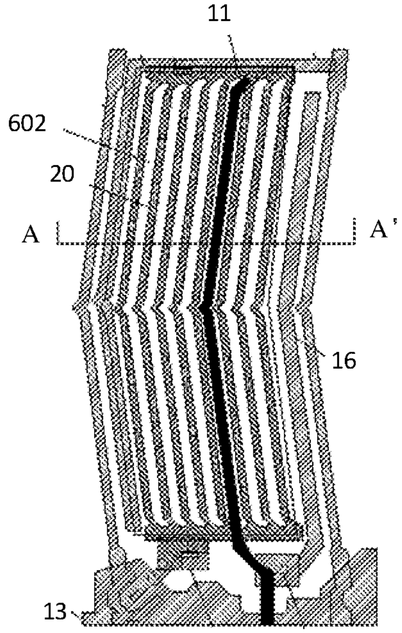
FIG. 14 is a schematic view of an array substrate provided by an embodiment of the present application.

FIG. 13 is s part of schematic view of a pixel electrode of an array substrate provided by an embodiment of the present application, and FIG. 14 is a schematic view of an array substrate provided by an embodiment of the present application.

In some embodiments, as illustrated in FIG. 13, the pixel electrode 20 can have a plurality of slits 602 and in this case the pixel electrode is the first electrode. Each of the plurality of slits 602 has a body portion 607 and at least one end portion 603, the orthographic projection of the wire 11 on the base substrate is within an orthographic projection of the main body portion on the base substrate in the direction of the row of the sub-pixel units (the first direction), as illustrated in FIG. 14.

In some embodiment, the slits 602 of the pixel electrode includes at least one first corner end (end portion) 603. The first corner end 603 in the display substrate of the embodiment of the present disclosure can reduce the trace mura problem of the liquid crystal display substrate. It should be noted that the corner end of the present disclosure is illustrated as an example in which the bending direction of the corner end and the bending direction in the middle of the slit is the same and the corner end is bent to the right as shown in FIG. 13. Alternatively, the bending direction of the corner end is different from the bending direction of the middle part of the slit, or the bending direction of the corner ends at both ends of the same slit is different.

Figure 15:
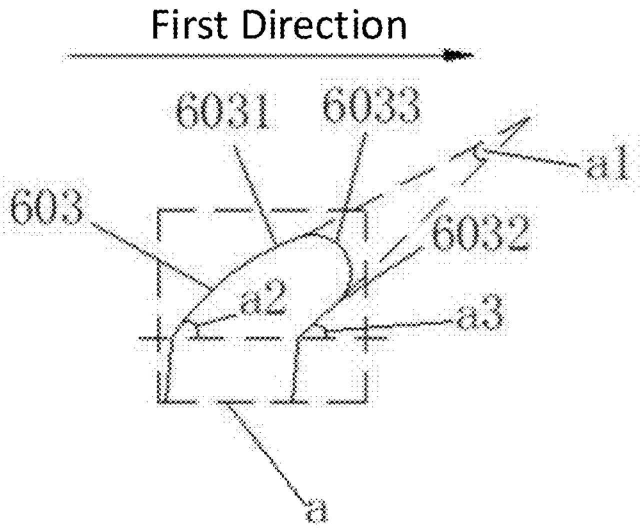
FIG. 15 is an enlarged view of part a of FIG. 13.

FIG. 15 is a partial enlarged view at a in FIG. 13. The embodiment of the present disclosure shows that the end of the first corner end 603 of the pixel electrode 20 in the substrate is an arc shape that protrudes in a direction away from the first corner end 603. The embodiment of the present disclosure shows that the arc-shaped end of the first corner end 603 in the substrate under the action of external force can improve the problem of liquid crystal arrangement disorder, so that the liquid crystal arrangement can recover faster, and reduce the trace mura of the liquid crystal display substrate.

In an exemplary embodiment, as illustrated in FIG. 15, the first corner end 603 includes a first side 6031 and a second side 6032 disposed oppositely, and first transition edge 6033 which connects the end of the first side 6031 and the end of the second side 6032. Both the first side 6031 and the second side 6032 may be curved or straight. A first included angle a1 is formed between the first side 6031 and the second side 6032, and the first included angle a1 may be 0° to 13°. For example, the first included angle a1 may be 9° to 11°. For example, the first included angle a1 may be 9.5°, 10°, or 10.5°. It should be noted that if the two sides do not intersect, the angle between the two sides is the angle at the intersection of the extension lines of the two sides. It should be noted that the ranges in the present disclosure include end values. For example, the angle of the first included angle a1 may be 0° to 13°, and the third included angle a3 may be 0° or 13°.

Figure 16:
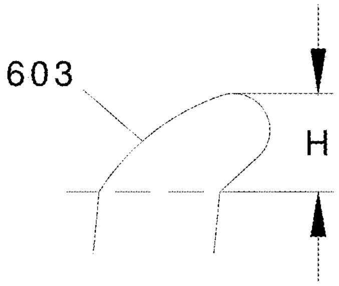
FIG. 16 is a schematic view of an end portion of slit of FIG. 13.

FIG. 16 is a schematic diagram showing the size of the first corner end of the substrate according to the embodiment of the disclosure. In an exemplary embodiment, as shown in FIG. 16, the orthographic projection length H of the first corner end in the direction perpendicular to the first direction is greater than or equal to 3 μm and less than or equal to 9 um.

Figure 17:
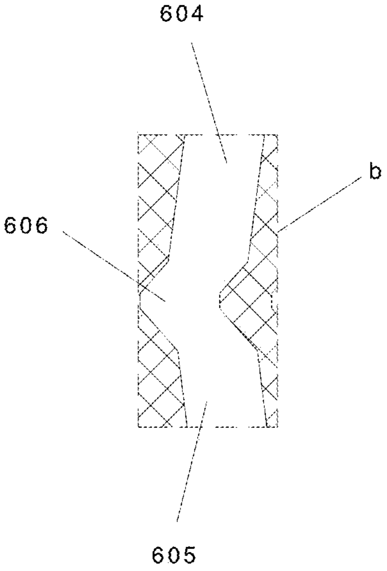
FIG. 17 is an enlarged view of part b of FIG. 13.

FIG. 17 is a partial enlarged view at b in FIG. 14. In an exemplary embodiment, as shown in FIG. 17, the body portion 607 of the slit 602 further includes a first body portion 604 extending in a third direction and a second body portion extending in a fourth direction, and a connection portion 606 which connect the first body portion 604 and second body portion 605. The connecting portion 606 is V-shaped.

In some embodiments, as shown in FIG. 1*a*, the wire 11 is adjacent to two data lines of the data lines 16, the two data lines comprise a first data line 161 and a second data line 162, a distance of the wire 11 to the first data line 161 is larger than a distance of the wire 11 to the second data line 162 in the direction of the row of the sub-pixel units, and a drain electrode of a transistor (TFT) of the sub-pixel unit is provided between the first data line 161 and the wire 11.

In some embodiments, a ratio of the distance of the wire 11 to the first data line 161 to the distance of the wire 11 to the second data line 162 ranges from 1.2 to 1.8. For example, the ratio can be 1.3, 1.4, 1.5, 1.6 and 1.7.

For example, the first electrode can have four slits, and the wire corresponds to a third slit of the four slits in position, as shown in FIG. 1*a*.

For example, the first electrode can have six slits, and the wire corresponds to a fourth slit of the six slits in position.

For example, the first electrode can have seven slits, and the wire corresponds to a fifth slit of the seven slits in position.

In some embodiments, the wire is adjacent to two data lines of the data lines, the two data lines comprise a first data line and a second data line, a distance of the wire to the first data line is substantially equal to a distance of the wire to the second data line.

For example, the first electrode has three slits, and the wire corresponds to a second slits of the three slits in position.

Figure 18:
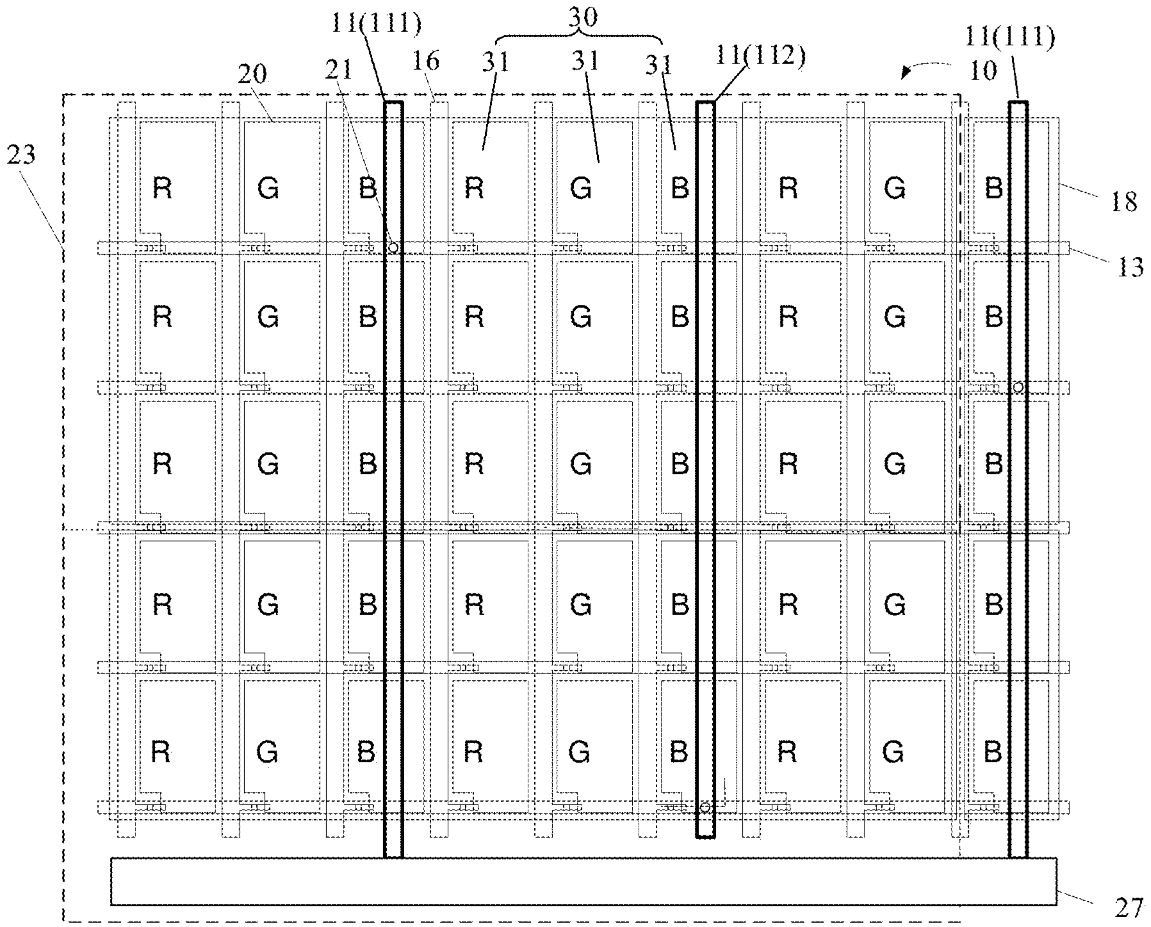
FIG. 18 is a structure diagram of an array substrate provided in an embodiment of the present disclosure.

FIG. 18 is a structure diagram of an array substrate provided in an embodiment of the present disclosure.

In some embodiments, as illustrated in FIG. 18, the wires 11 comprises a plurality of first wires 111 and a plurality of second wires 112, each of the first wires 111 is connected to a driving circuit 27 which drives a touch function and a display function, and each of the second wires 112 is not connected the driving circuit, that is, the second wire is dummy wire. The dummy wire can be connected to the common electrode block 23 by vias to reduce resistance. Alternatively, the dummy wire can not be connected to the common electrode block 23 by vias, to avoid uneven surface of the common electrode block due to the vias and in this case, the dummy wire is a floating wire.

According to the embodiments of the present disclosure, the wire can be disposed in each pixel unit (as illustrated in FIG. 1*b*) or can be disposed in each sub-pixel unit (as illustrated in FIG. 3) based on aspect ratio of the array substrate. The aspect ratio is the ratio of a length of the array substrate in the first direction to a width of the array substrate in the second direction. The aspect ratio is larger, the number of the wire is more.

In some embodiments, one wire is disposed in each of the pixel units, the first wire 111 and the second wire 112 are mixed in the direction of the row of sub-pixels. For example, the first wire 111 and the second wire 112 are disposed in each of the pixel units alternately. As illustrated in FIG. 18, one second wire 112 is disposed between two adjacent first wires 111. Alternatively, the wires can be arranged as first wire, second wire, second wire, first wire, second wire, second wire, . . . , or can be arranged as first wire, second wire, second wire, second wire, first wire, second wire, second wire, second wire, . . . . Those skilled in the art can design other arrangement of the first wire and the second wire from practice requirements.

In some embodiments, wherein only one wire is disposed in each of the sub-pixel units, as illustrated in FIG. 3. The first wire 111 and the second wire 112 are mixed in the direction of the row of sub-pixels. For example, the first wire 111 and the second wire 112 are disposed in each of the sub-pixel units alternately, and one second wire 112 is disposed between two adjacent first wires 111. Alternatively, the wires can be arranged as first wire, second wire, second wire, first wire, second wire, second wire, . . . , in each of the sub-pixel units or can be arranged as first wire, second wire, second wire, second wire, first wire, second wire, second wire, second wire, . . . , in each of the sub-pixel units. Those skilled in the art can design other arrangement of the first wire and the second wire in each of the sub-pixel units from practice requirements.

Figure 19:
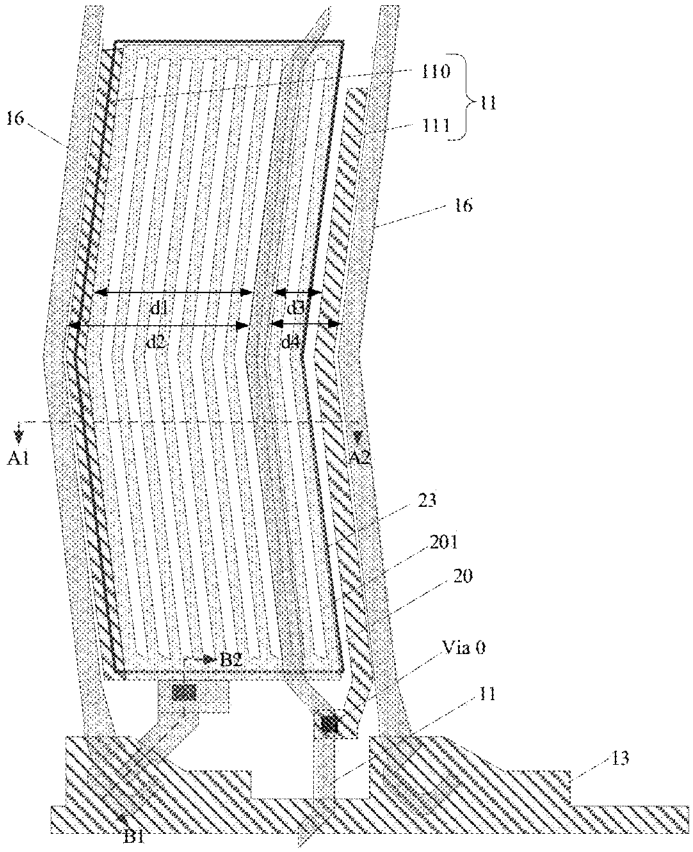
FIG. 19 is a schematic view of a pixel electrode of an array substrate provided in an embodiment of the present disclosure.

FIG. 19 is a schematic view of a pixel electrode of an array substrate provided in an embodiment of the present disclosure.

As illustrated in FIG. 19, the function electrode 11 is located on the base substrate 60, the function electrode 11 includes a first sub-function electrode portion 110 and a second sub-function electrode portion 111. The extending direction of the two sub-function electrode portions 110, 111 is the same as the extending direction of the data line 16, the first sub-function electrode portion 110 is located on the first side of the opening region of the sub-pixel, and the second sub-function electrode portion 111 is located on the second side of the opening region of the sub-pixel. The first side and the second side are opposite along the extending direction perpendicular to the data line 16. The second sub-function electrode portion 111 is connected to the wire 11 by via 0.

Figure 20:
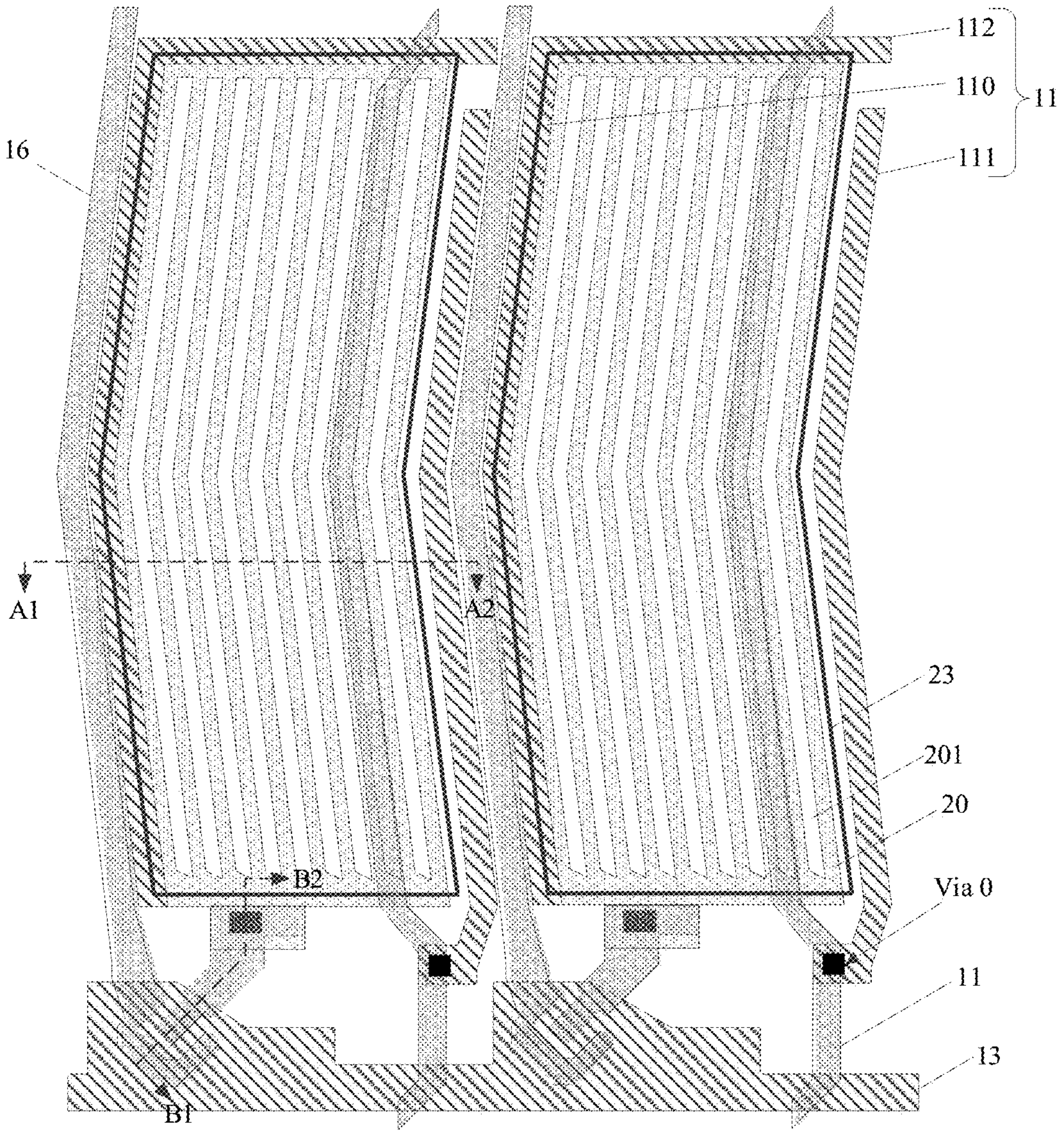
FIG. 20 is a schematic view of a pixel electrode of an array substrate provided in an embodiment of the present disclosure.

FIG. 20 is a schematic view of a pixel electrode of an array substrate provided in an embodiment of the present disclosure.

In some embodiments, as illustrated in FIG. 20, the function electrode 11 further includes a third sub-function electrode portion 112, the extending direction of the third sub-function electrode portion 112 is the same as the extending direction of the gate line 13, and the third sub-function electrode portion 112 is electrically connected to the first sub-function electrode portion 110.

Both the first sub-function electrode portion 110 and the second sub-function electrode portion 111 can be made of materials with light-shielding properties, such as metal materials, but are not limited to this.

At least one embodiment of the present disclosure further provides a touch panel including the above-mentioned array substrate 10. The touch panel may be applied to any products or components with display function such as liquid crystal display panels, electronic paper, organic light emitting diode (OLED panel), cellphones, tablet computers, TV sets, displays, notebook computers, digital picture frames, and navigators.

Figure 6:
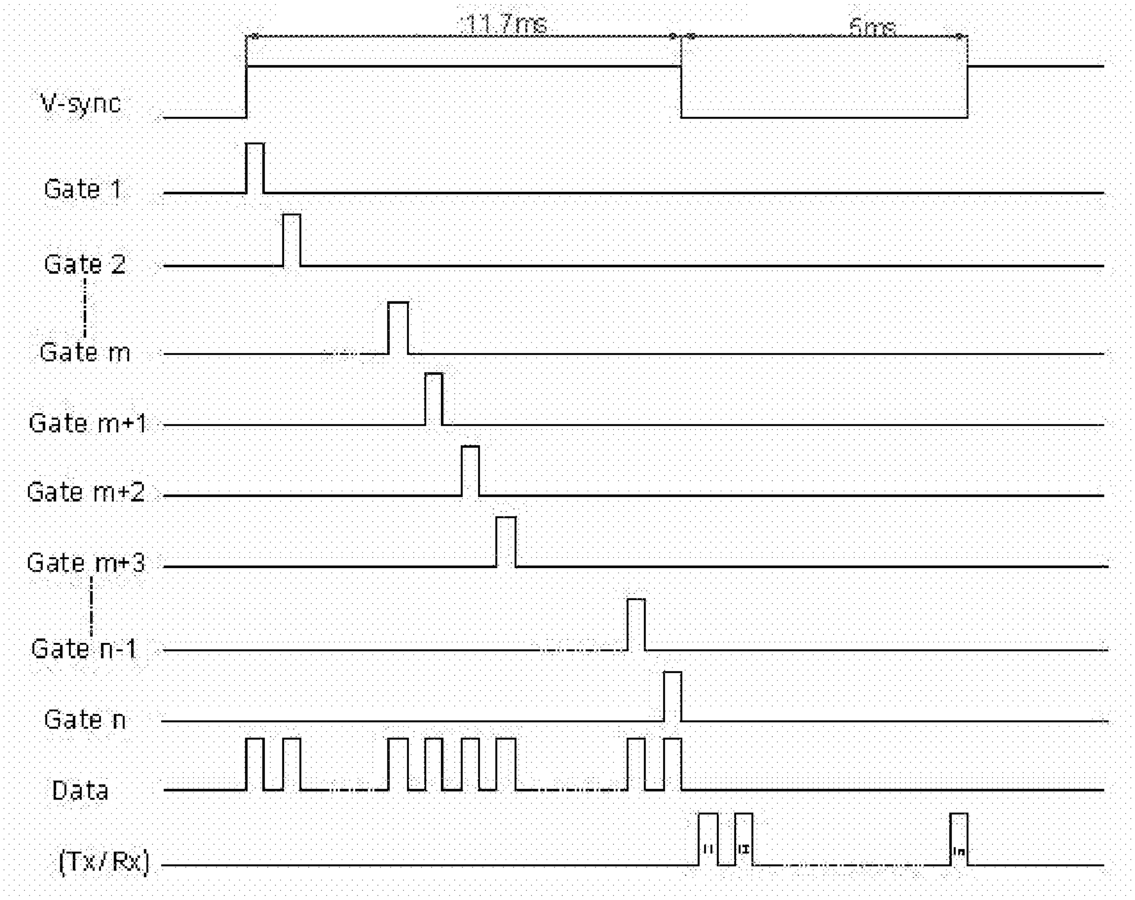
FIG. 6 is a timing diagram for a time-division-driven touch panel provided in an embodiment of the present disclosure.

Since the touch panel in the above-mentioned embodiments combines touch function and display function, it can implement touch function and display function. In order to prevent touch signals received by common electrode blocks doubling as self-capacitance electrodes from being influenced by gate lines and data lines for implementing display function in the array substrate while implementing touch function, the touch panel is generally driven in a time-division manner. For example, in the total driving period T for 1 frame of signals, interval T1 is used to drive display function, interval T2 is used to drive touch function, wherein T=T1+T2. For example, referring to FIG. 6, the total driving period T for 1 frame of signals is 16.7 ms, T1 is 11.7 ms, T2 is 5 ms, the first 11.7 ms in the frame is used to drive display function, and the latter 5 ms of the above-mentioned 1 frame of signals is used to drive touch function. In FIG. 6, Gate 1 to Gate n are gate line signals, Data is data line signals, Tx/Rx is signal for driving touch function by common electrode blocks doubling as self-capacitance electrodes.

Figure 7:
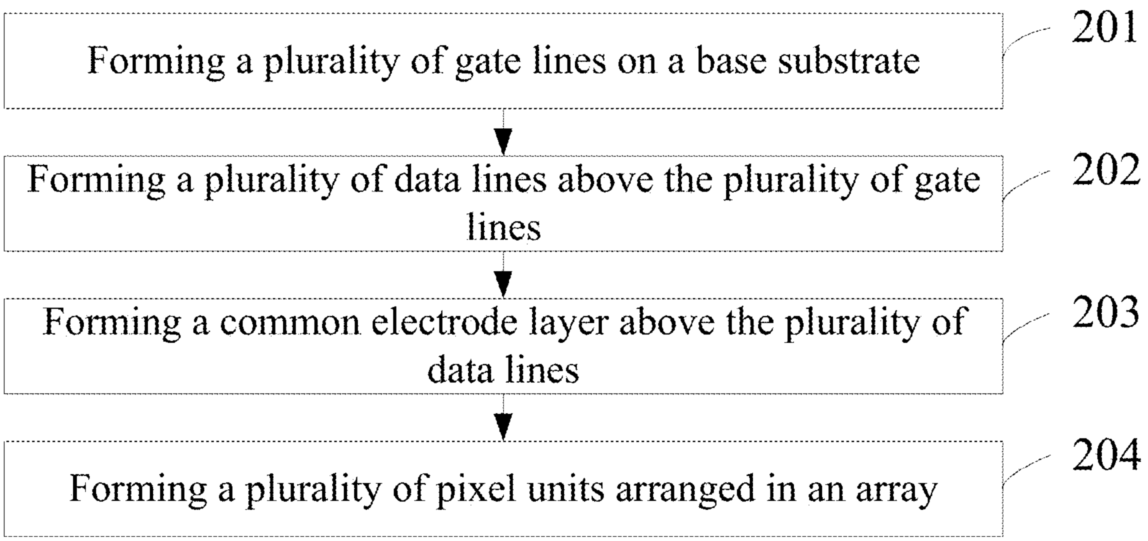
FIG. 7 is a flow chart of a manufacturing method of an array substrate provided in an embodiment of the present disclosure.

As illustrated in FIG. 7, at least one embodiment of the present disclosure further provides a manufacturing method of the above-mentioned array substrate, including the following steps 201 to 204, which will be described in detail below.

In step 201, a plurality of gate lines 13 are formed on the base substrate 12. For example, a gate line layer is formed first on the base substrate 12, and then the pattern including a plurality of gate lines 13 is formed by a patterning process.

In step 202, a plurality of data lines 16 are formed on the base substrate 12 (for example, above the plurality of gate lines 13). For example, a data line layer is formed first on the plurality of gate lines 13, and then the pattern including a plurality of data lines 16 is formed by a patterning process.

In step 203, a common electrode layer 18 is formed on the base substrate 12 (for example, above the plurality of data lines 16), which includes a plurality of common electrode blocks 23 that double as self-capacitance electrodes and each of which is connected with at least one wire 11. For example, the wires 11 and the data lines 16 are disposed in the same layer. Therefore, the data lines 16 and the wires 11 may be formed with one patterning process in the manufacturing process of array substrate 10.

In step 204, a plurality of pixel units arranged in an array are formed; each of which includes a plurality of sub-pixel units defined by the gate lines 13 and the data lines 16 disposed to intersect each other laterally and vertically; and the wires 11 are located in the middle of the sub-pixel units of the same column.

In the manufacturing method of array substrate provided in the embodiment of the present disclosure, the wires and the data lines (or the gate lines) may be disposed in the same layer such that they can be formed in one and the same patterning process, thereby reducing one masking step. Of course, the wires and the data lines (or the gate lines) may also be disposed in different layers.

In embodiments of the present disclosure, in the process of manufacturing the array substrate 10, the wires 11 connected with common electrodes 18 are manufactured in the middle of sub-pixel units of the same column which belong to opening regions not covered by the black matrix, and the black matrix only needs to cover the data lines 16 (or the gate lines 13), but not to cover the wires 11, and spaces between the data lines 16 (or the gate lines 13) and the wires 11.

Therefore, embodiments of the present disclosure can reduce the coverage of black matrix, increase the area of opening regions, and in turn increase the aperture ratio of pixel units. In an embodiment of the present disclosure, in the process of manufacturing array substrate 10, the wires 11 connected with the common electrode blocks and the data lines 16 (or gate lines 13) are disposed in the same layer. In the process of manufacturing the array substrate 10, the data lines 16 (or the gate lines 13) and the wires 11 may be formed by one patterning process, thereby reducing the masking step of separately shaping wires 11, namely reducing one masking step.

Figure 8:
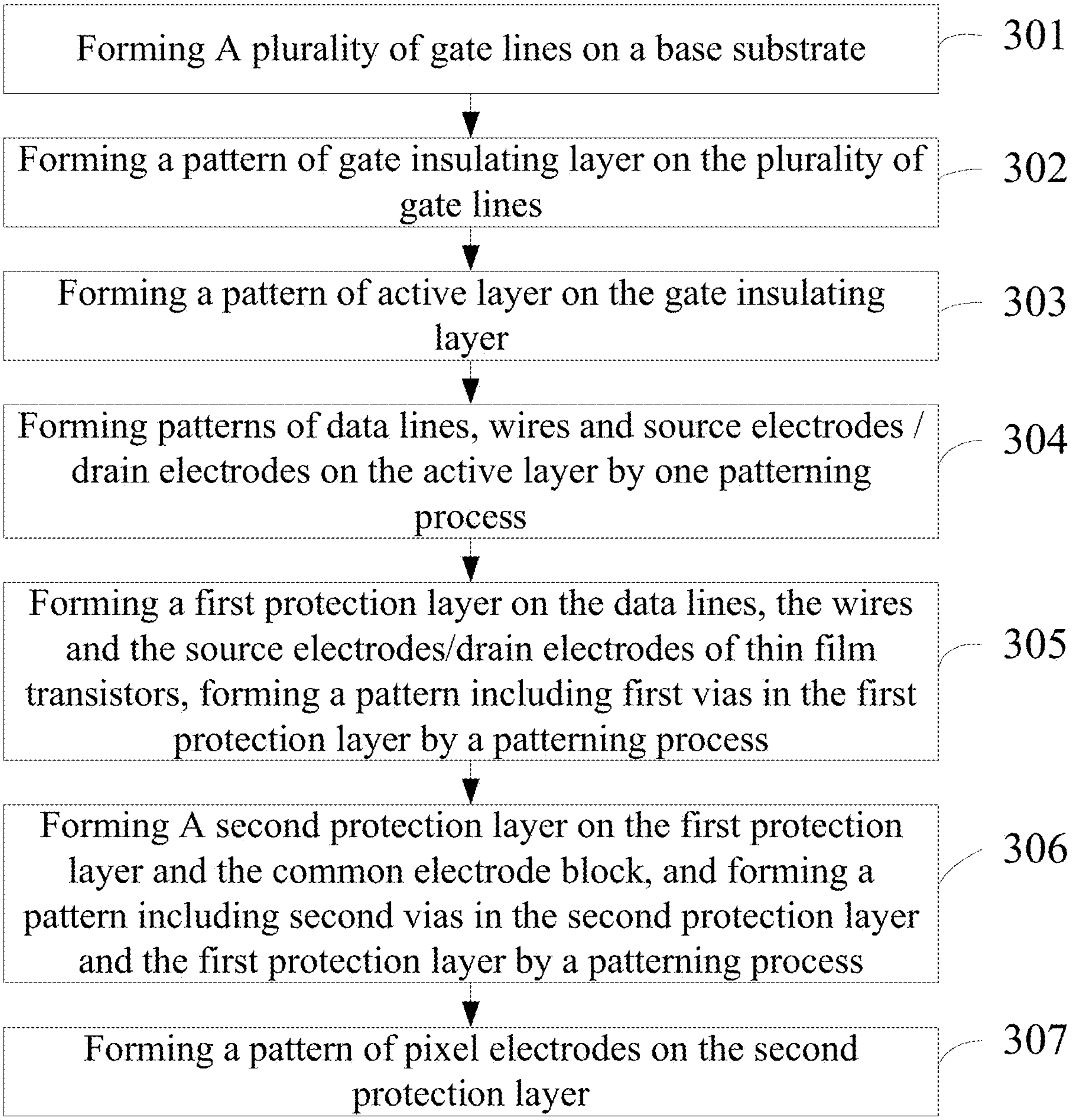
FIG. 8 is a flow chart of a specific implementation of the manufacturing method of an array substrate provided in an embodiment of the present disclosure.

The manufacturing process of array substrate 10, particularly the manufacturing method of sub-pixel units in array substrate 10 will be explained in detail below with reference to FIG. 5. As illustrated in FIG. 8, the manufacturing method of the array substrate 10 includes, for example, the following steps 301 to 307.

In step 301, a plurality of gate lines 13 are formed on the base substrate 12. For example, while forming a plurality of gate lines 13, gate electrodes in thin film transistors 23 are also formed.

In step 302, a pattern of gate insulating layer 14 is formed on the plurality of gate lines 13. It is to be noted that, each of the thin film transistors 23 having a gate electrode under the gate insulating layer 14 is described as an example in the embodiment of the present disclosure.

In step 303, a pattern of active layer 15 is formed on the gate insulating layer 14, which includes regions corresponding to source electrodes 25, drain electrodes 26 and channels between source electrodes/drain electrodes to be formed and regions corresponding to the wires 11 to be formed.

In step 304, patterns of data lines 16, wires 11 and source electrodes 25/drain electrodes 26 are formed on the active layer 15 by one patterning process. It is possible to form the data lines 16, the wires 11 and the source electrodes 25/drain electrodes 26 by one patterning process, that is, step 304 may be accomplished with one masking process.

In step 305, a first protection layer 17 is formed on the data lines 16, the wires 11 and the source electrodes 25/drain electrodes 26 of thin film transistors 23, a pattern including first vias 21 is formed in the first protection layer 17 by a patterning process, wherein the common electrode blocks 23 are located on the first protection layer 17 and connected with the wires 11 through the first vias 21.

In step 306, a second protection layer 19 is formed on the first protection layer 17 and the common electrode block 23, and a pattern including second vias 22 is formed in the second protection layer 19 and the first protection layer 17 by a patterning process.

In step 307, a pattern of pixel electrodes 20 is formed on the second protection layer 19, wherein the pixel electrodes 20 are connected with the drain electrodes 26 through the second vias 22.

Since the wires 11 and the data lines 16 are disposed in the same layer, after forming the data line layer on the gate insulating layer 14, a pattern of data lines 16 and wires 11 is formed by one patterning process, no separate masking step is needed for the wires 11, which saves one masking step, reducing the number of masking in the manufacturing process of array substrate 10, and simplifying the manufacturing flow of array substrate 10.

In the above description of implementations, specific features, structures, materials or characteristics may be combined as appropriate in any one or more of embodiments or examples.

What are described above is related to the illustrative embodiments of the disclosure only and not limitative to the scope of the disclosure; the scopes of the disclosure are defined by the accompanying claims.

What is claimed is:

1. An array substrate comprising:

a base substrate;

a plurality of gate lines, a plurality of data lines, a common electrode layer, and a plurality of pixel units, arranged in an array disposed on the base substrate, wherein each of the pixel units comprises a plurality of sub-pixel units defined by the gate lines and the data lines disposed to intersect each other laterally and vertically;

a plurality of wires, wherein the common electrode layer comprises a plurality of common electrode blocks that double as self-capacitance electrodes, each of the common electrode blocks is connected to at least one corresponding wire of the plurality of wires, the common electrode blocks are connected with the wires through first vias, wherein two adjacent data lines of the plurality of data lines define a column of the sub-pixel units, two adjacent gate lines of the plurality of gate lines define a row of the sub-pixel units, the wires and the data lines are disposed in a same layer and extend in a same direction of the column of the sub-pixel units; and a plurality of pixel electrodes, wherein an orthographic projection of the at least one corresponding wire on the base substrate crosses an orthographic projection of each of pixel electrodes of the column of the sub-pixel units on the base substrate, a width of the wire in a direction of the row of the sub-pixel units is less than a width of a pixel electrode in the direction of the row of the sub-pixel units in a region where the orthographic projection of the at least one of the wires on the base substrate and the orthographic projection of pixel electrodes of the column of the sub-pixel units overlap, the pixel unit comprises at least a red sub-pixel unit, a blue sub-pixel unit, and a green sub-pixel unit, sub-pixel units with a same color at which the wires are located belong to different ones of the pixel units, a same column of the sub-pixel units has a same color, a same row of the sub-pixel units are arranged in a sequence of red, green, and blue, an extending direction of the wires is the same as an extending direction of the column of the blue sub-pixel units, only one wire is disposed in each sub-pixel unit, each of the column of the sub-pixel units comprises one wire, wherein the array substrate comprises a first electrode and a second electrode, and in a direction perpendicular to the base substrate, the second electrode is disposed between the base substrate and the first electrode, the first electrode is a common electrode and the second electrode is the pixel electrode, or the first electrode is the pixel electrode and the second electrode is the common electrode, the first electrode has a plurality of slits extending in the direction of the column of the sub-pixel units, an orthographic projection of at least one gate line of the plurality of gate lines on the base substrate at least partially overlaps with an orthographic projection of at least one of the first vias on the base substrate, wherein the plurality of slits comprises at least one first slit and at least one second slit, one of the wires corresponds in position to the at least one second slit, the first electrode of each of the sub-pixel units in the same column of the sub-pixel units has a same count of the slits, the at least one first slit and the at least one second slit of the first electrode of each of the sub-pixel units in the same column of the sub-pixel units are arranged in a same sequence, and wherein a width of the at least one second slit in the direction of the row of the sub-pixel units is larger than a width of the at least one first slit in the direction of the row of the sub-pixel units, and the second slit and each of adjacent data lines are separated by the at least one first slit.

2. The array substrate of claim 1, wherein a distance from the orthographic projection of the wire on the base substrate to an orthographic projection of one of the two adjacent data lines on the base substrate in the direction of the row of the sub-pixel units is different from a distance from the orthographic projection of the wire on the base substrate to an orthographic projection of another of the two adjacent data lines on the base substrate in the direction of the row of the sub-pixel units.

3. The array substrate of claim 1, wherein a count of the at least one first slit between the second slit and each of the adjacent data lines are different.

4. The array substrate of claim 1, further comprising:

a drain electrode connected to the data lines, wherein the pixel electrode is connected to the drain electrode via a second via, and a distance from an orthographic projection of the first via on the base substrate to an orthographic projection of a gate line on the base substrate is less than a distance from an orthographic projection of the second via on the base substrate to the orthographic projection of the gate line on the base substrate.

5. The array substrate of claim 1, wherein each of the plurality of slits has a body portion and at least one end portion, the orthographic projection of the wire on the base substrate is within an orthographic projection of the body portion on the base substrate in the direction of the row of the sub-pixel units.

6. The array substrate of claim 1, wherein an orthographic projection of a center of the first via on the base substrate and an orthographic projection of the gate line on the base substrate overlap.

7. An array substrate comprising:

a base substrate;

a plurality of gate lines, a plurality of data lines, a common electrode layer, and a plurality of pixel units, arranged in an array disposed on the base substrate, wherein each of the pixel units comprises a plurality of sub-pixel units defined by the gate lines and the data lines disposed to intersect each other laterally and vertically;

a plurality of wires, and a driving integrated circuit (IC), wherein the common electrode layer comprises a plurality of common electrodes that double as self-capacitance electrodes, each of a plurality of common electrode blocks is connected to the driving IC through at least one of the plurality of wires, the common electrode blocks are connected with the wires through first vias, wherein two adjacent data lines of the plurality of data lines define a column of the sub-pixel units, two adjacent gate lines of the plurality of gate lines define a row of the sub-pixel units, the wires and the data lines are disposed in a same layer and extend in a same direction of the column of the sub-pixel units; and a plurality of pixel electrodes, wherein an orthographic projection of the at least one corresponding wire on the base substrate crosses an orthographic projection of each of pixel electrodes of the column of the sub-pixel units on the base substrate, a width of the wire in a direction of the row of the sub-pixel units is less than a width of the pixel electrode in the direction of the row of the sub-pixel units in a region where the orthographic projection of the at least one of the wires on the base substrate and the orthographic projection of pixel electrodes of the column of the sub-pixel units overlap, the pixel unit comprises at least a red sub-pixel unit, a blue sub-pixel unit, and a green sub-pixel unit, sub-pixel units with a same color at which the plurality of wires are located belong to different ones of the pixel units, a same column of the sub-pixel units has a same color, a same row of the sub-pixel units are arranged in a sequence of red, green, and blue, an extending direction of the wires is the same as an extending direction of the column of the sub-pixel units, only one wire is disposed in each sub-pixel unit, and each of the column of the sub-pixel units comprises one wire, wherein the array substrate comprises a first electrode and a second electrode, and in a direction perpendicular to the base substrate, the second electrode is disposed between the base substrate and the first electrode, the first electrode is the common electrode and the second electrode is the pixel electrode, or the first electrode is the pixel electrode and the second electrode is the common electrode, the first electrode has a plurality of slits extending in the direction of the column of the sub-pixel units, and the plurality of slits comprises at least one first slit and at least one second slit, one of the wire corresponds in position to the at least one second slit, the first electrode of each of the sub-pixel units in the same column of the sub-pixel units has a same count of the slits, the at least one first slit and the at least one second slit of the first electrode of each of the sub-pixel units in the same column of the sub-pixel units are arranged in a same sequence, and wherein a width of the at least one second slit in the direction of the row of the sub-pixel units is larger than a width of the at least one first slit in the direction of the row of the sub-pixel units, an orthographic projection of at least one gate line of the plurality of gate lines on the base substrate at least partially overlaps with an orthographic projection of at least one of the first vias on the base substrate.

8. The array substrate of claim 7, wherein each of the plurality of slits has a body portion and at least one end portion, the orthographic projection of the wire on the base substrate is within an orthographic projection of the body portion on the base substrate in the direction of the row of the sub-pixel units.

9. The array substrate of claim 7, wherein the wire has at least one part located in a first region where an orthographic projection of the first via on the base substrate and an orthographic projection of the wire on the base substrate overlap and having a width larger than a width of the wire located in a second region other than the first region a central axis of the at least one part substantially coincides with a central axis of the gate line in an extending direction of the gate line.

10. The array substrate of claim 7, wherein each of the sub-pixel units has an opening region, and the wire is located in the opening region, the wires connected with common electrodes are provided in the middle of sub-pixel units of the same column which belong to the opening regions not covered by a black matrix.

11. The array substrate of claim 10, wherein the wire is adjacent to two data lines of the data lines, the two data lines comprise a first data line and a second data line, a distance of the orthographic projection of the wire on the base substrate to an orthographic projection of the first data line on the base substrate is different from a distance of the orthographic projection of the wire on the base substrate to an orthographic projection of the second data line on the base substrate in the direction of the row of the sub-pixel units, and a drain electrode of a transistor of the sub-pixel units is provided between the first data line and the wire.

12. The array substrate of claim 11, wherein a ratio of the distance of the wire to the first data line to the distance of the wire to the second data line ranges from 1.2 to 1.8.

13. The array substrate of claim 10, wherein the wire is adjacent to two data lines of the data lines, the two data lines comprise a first data line and a second data line, a distance of the orthographic projection of the wire on the base substrate to an orthographic projection of the first data line on the base substrate is substantially equal to a distance of the orthographic projection the wire on the base substrate to an orthographic projection of the second data line on the base substrate.

14. The array substrate of claim 7, wherein the wires comprise a plurality of first wires and a plurality of second wires, each of the first wires is connected to a driving circuit which drives a touch function and a display function, each of the second wires is not connected the driving circuit, and the first wires and the second wires are mixed in the direction of the row of the sub-pixel units.

15. The array substrate of claim 7, further comprising:

a drain electrode connected to the data lines, wherein the pixel electrode is connected to the drain electrode via a second via, and a distance from an orthographic projection of the first via on the base substrate to an orthographic projection of a gate line on the base substrate is less than a distance from an orthographic projection of the second via on the base substrate to the orthographic projection of the gate line on the base substrate.

16. The array substrate of claim 7, wherein the width of the wire in the direction of the row of the sub-pixel units is greater than a width of at least one of the data lines in the direction of the row of the sub-pixel units.

* * * * *